(12) United States Patent
Campagna et al.

(10) Patent No.: US 10,048,067 B2
(45) Date of Patent: Aug. 14, 2018

(54) ACCELERATION OF STATIONARY ALIGNMENT MEASUREMENTS

(71) Applicants: Swen Campagna, Engelthal (DE); Wilfried Landschutz, Baiersdorf (DE); Michael Wullenweber, Erlangen (DE)

(72) Inventors: Swen Campagna, Engelthal (DE); Wilfried Landschutz, Baiersdorf (DE); Michael Wullenweber, Erlangen (DE)

(73) Assignee: Siemens Aktiengesellschaft, München (DE)

( * ) Notice: Subject to any disclaimer, the term of this patent is extended or adjusted under 35 U.S.C. 154(b) by 778 days.

(21) Appl. No.: 14/609,695

(22) Filed: Jan. 30, 2015

(65) Prior Publication Data
US 2015/0219453 A1 Aug. 6, 2015

(30) Foreign Application Priority Data
Jan. 31, 2014 (DE) ........................ 10 2014 201 710

(51) Int. Cl.
*G01V 3/00* (2006.01)
*G01B 21/22* (2006.01)
(Continued)

(52) U.S. Cl.
CPC ........... *G01B 21/22* (2013.01); *G01R 33/543* (2013.01); *G01R 33/583* (2013.01)

(58) Field of Classification Search
CPC ..... G01B 21/22; G01R 33/543; G01R 33/583
(Continued)

(56) References Cited

U.S. PATENT DOCUMENTS

| 2005/0264288 A1 | 12/2005 | Campagna et al. |
| 2009/0012736 A1 | 1/2009 | Arnold et al. |
| 2010/0274118 A1 | 10/2010 | Arnold et al. |

FOREIGN PATENT DOCUMENTS

| DE | 102005019859 A1 | 12/2005 |
| DE | 102007030624A1 A1 | 1/2009 |
| DE | 102009018876A1 A1 | 11/2010 |

OTHER PUBLICATIONS

Maclaren et al., Measurement and Correction of Microscopic Head Motion during Magnetic Resonance Imaging of the Brain, Nov. 2012, PLoS One, vol. 7, Issue 11, e48088.*
(Continued)

*Primary Examiner* — Susan Lee
(74) *Attorney, Agent, or Firm* — Lempia Summerfield Katz LLC

(57) ABSTRACT

The embodiments relate to a method for the optimization of alignment measurements in which a MR facility is configured to a measurement object. First alignment measurements are carried out while the measurement object is being moved through the MR facility, wherein at least one MR system parameter of the MR facility is configured to the measurement object of the first alignment measurements. A second alignment measurement is also carried out in which the measurement object is stationary in a fixed position in the MR facility, wherein the second alignment measurement includes an iterative alignment method in which the at least one MR system parameter for the recording of MR signals of the measurement object is iteratively configured to the measurement object in the fixed position in the MR facility, wherein for the iterative alignment method the aligned MR system parameter is chosen from the aligned MR system parameters.

19 Claims, 3 Drawing Sheets

(51) Int. Cl.
G01R 33/54 (2006.01)
G01R 33/58 (2006.01)

(58) Field of Classification Search
USPC .......................................................... 324/309
See application file for complete search history.

(56) References Cited

OTHER PUBLICATIONS

German Office Action for related German Application No. 10 2014 201 710.6, dated Jan. 29, 2015, with English Translation.

* cited by examiner

ACCELERATION OF STATIONARY ALIGNMENT MEASUREMENTS

CROSS-REFERENCE TO RELATED APPLICATIONS

This application claims the benefit of DE 10 2014 201 710.6, filed on Jan. 31, 2014, which is hereby incorporated by reference in its entirety.

TECHNICAL FIELD

The present embodiments relate to a method for carrying out alignment measurements in a magnetic resonance (MR) facility in which the MR facility is configured to the measurement object arranged in the MR facility. The embodiments also relate to an associated MR facility and to an electronically readable data carrier.

BACKGROUND

Methods based on magnetic resonance, such as magnetic resonance tomography (MRS) or spectroscopy (MRS), require adapted and good physical ambient conditions to provide optimum quality of the recorded data. This applies by way of example to the spatial homogeneity, stability over time, and the absolute accuracy of the associated magnetic fields, (e.g., of the $B_0$ field, which is provided to generate the magnetization, and of the $B_1$ field with which the magnetization is tilted out of equilibrium). The measurement object located in the $B_0$ field obtains magnetization by way of the basic magnetic field $B_0$, and for the detection of measuring signals this magnetization is disrupted by the emission of high frequency pulses (HF pulses), the $B_1$ field. The magnetization that returns to state of equilibrium is spatially encoded during imaging by the connection of encoding magnetic field gradients and is received by one or more receiving coil(s). A HF pulse generates an amplitude-modulated $B_1$ field oscillating with a carrier frequency, and this is oriented perpendicularly to the $B_0$ field. The angle of tilt a describes the tilting of the magnetization from the state of equilibrium and influences contrast and signal intensity of the received signals. If a desired angle of tilt is not attained during a resonance excitation, then this leads to contrast and signal losses.

The $B_1$ field generated by a HF pulse depends not just on a controllable initial voltage of a HF unit, which generates the HF pulse, but also on a load dependent on the measurement object, which depends on the examination object/ measurement object. For this reason, for accurate determination of the angle of tilt, the initial voltage of the high frequency amplifier is determined for each examination object and for each position of the examination object in the basic magnetic field in one alignment. The initial voltage generates a specific $B_1$ field and therewith a desired angle of tilt for a standardized HF pulse. Static field disruptions and spatial variations in the HF field due in particular to the measurement object and susceptibility may be taken into account. These measurement object-dependent alignments are determined before the actual measurement, and this may be an imaging measurement or a spectroscopic measurement. If the boundary conditions, such as the table position, e.g., the position of the measurement object in the magnet, or the choice of transmitting and receiving coils, change then the measurement object-dependent alignments have to be carried out again.

In addition to this alignment of the initial voltage mentioned above, the transmitter alignment, a frequency alignment is also carried out in which the HF carrier or center frequency is configured to the resonance frequency of the excited nuclei being considered. A further, third alignment is conventionally carried out twice, namely one alignment in which a voltage measured at a directional coupler directly behind the HF amplifier is compared with the voltage effectively applied at the transmitting coil. During this alignment, the measured values are recorded and other components of the MR facility provided. This last alignment is conventionally carried out twice, namely once before the frequency and transmitter alignment to determine rough characteristic values and a second time thereafter by taking into account the results of the frequency and transmitter alignment.

If the actual MR measurement, for which the alignments are carried out, occurs in a fixed position of the measurement object in the MR facility, then the stationary alignments are conventionally carried out in this fixed position.

Alternatively, for several years, it has been possible to also record MR data in the case of a moving measurement object. Measurement object-dependent alignments are also carried out in this connection by moving the entire region of the measurement object to be examined through the isocenter of the magnet of the MR facility. The alignment characteristic values are determined in a grid of several centimeters, so that the measurement object-dependent alignments do not have to be repeated again later for changing examination positions. The quality of the alignment results determined in the case of moving measurement objects is much poorer, however, since with continuous movement of the measurement object no iteration is carried out, as in the case of the stationary alignment measurements. The results of the alignment measurement in the case of a moving measurement object may not replace the stationary alignments therefore.

The iterative methods used in the case of the stationary alignments are very time-consuming and are regarded as disruptive by the user.

SUMMARY AND DESCRIPTION

The scope of the present invention is defined solely by the appended claims and is not affected to any degree by the statements within this summary. The present embodiments may obviate one or more of the drawbacks or limitations in the related art.

It is an object of the present embodiments to accelerate the alignment measurements in stationary measurement objects.

A method for carrying out alignment measurements in a MR facility is carried out in which the MR facility is configured to the measurement object arranged in the MR facility. First alignment measurements are carried out while the measurement object is being moved through the MR facility, wherein at least one MR system parameter of the MR facility is configured to the measurement object in the case of the first alignment measurements, whereby one aligned MR system parameter respectively is determined for different positions of the measurement object in the MR facility. A second alignment measurement is also carried out in which the measurement object is stationary in a fixed position in the MR facility. The second alignment measurement includes an iterative alignment method in which the at least one MR system parameter for the recording of MR signals of the measurement object is iteratively configured to the measurement object in the case of the fixed position in the MR facility. For the iterative alignment method, the aligned MR system parameter is chosen from the aligned MR system parameters, determined in the first alignment measurements for the different positions, whose position best matches the fixed position in which the second alignment measurement is carried out. The chosen aligned MR system parameter is used as a start value for the iterative alignment method in the case of the fixed position.

By using the results from the first alignment measurements with a moving measurement object the iteration may be improved and accelerated since the start value from the alignment in the case of the moving object is used for iteration. Previously, the alignment measurements in the case of the moved measurement object and the stationary measurement object were dealt with strictly separately, e.g., a fixed start value of the MR system parameter was used in the iteration. The results from alignment measurements in the case of a moving measurement object were not taken into account here. Iteration acts may be omitted due to the improved start parameter, so that iteration is shortened overall, whereby the iterative second alignment measurement may be significantly accelerated.

The MR facility may have a HF unit for generating and emitting HF pulses into the measurement object, wherein the MR system parameter is a HF parameter of the HF unit that is configured to the measurement object. By way of example, the first alignment measurements may include a frequency alignment in which the frequency of the HF pulses is configured to the resonance frequency of the measurement object in order to determine a respective carrier frequency, whereby one MR carrier frequency respectively is determined for different positions of the measurement object in the MR facility. In the case of the second alignment measurement, a MR carrier frequency in the case of the fixed position is likewise determined in the iterative alignment method. For the iterative alignment method, the carrier frequency is chosen from the first alignment measurements whose associated position best matches the fixed position. This provides that for the fixed position the associated carrier frequency from the first alignment measurements is determined, which in terms of its position best matches the fixed position. This chosen aligned carrier frequency from the first alignment measurement is used as a start value for the iterative alignment method in the case of the fixed position in order to determine the carrier frequency in the case of the second alignment measurement.

The first alignment measurements may also include an alignment of a reference voltage that is used for generating the HF pulses, whereby one reference voltage respectively is determined for different positions of the object in the MR facility. In the case of the second alignment measurement, a reference voltage in the case of the fixed position is determined in the iterative alignment method, and the reference voltage chosen from the first alignment measurements whose associated position best matches the fixed position. This chosen aligned reference voltage from the first alignment measurements is used as a start value for the iterative alignment method in the case of the fixed position in order to determine the reference voltage in the case of the second alignment measurement.

If the corresponding values from the measurements in the case of a moving measurement object are used in both the determination of the carrier frequency and in the determination of the reference voltage, the gain in time is increased further since better start values are used in both iteration methods and the number of iteration acts may therefore be reduced.

The first alignment measurements provided as a prerequisite may be carried out while the measurement object is being moved into the MR facility for the first time during an examination. The time for the required first alignment measurements is shortened as a result since the measurement object is moved into the MR facility anyway for the positioning thereof in the MR facility. If the first alignment measurements are carried out in the process, the results thereof are available and may then be used for the second stationary iterative alignment.

In the case of the first alignment measurements, the MR system parameter, such as by way of example the reference voltage or trigger frequency, may be determined in each case for the position of the measurement object that is located in the isocenter of the MR facility. When the measurement object is moved into the MR facility, it is possible to move the measurement object beyond the isocenter to enlarge the section of the measurement object for which one position-dependent aligned MR parameter respectively is available from the first alignment measurements. Instead of stopping the movement of the measurement object if the measurement object is located in the isocenter, the movement may be continued in order to cover a larger area of the measurement object for which aligned MR system parameters are available from the first alignment measurement.

A third alignment measurement may also be made in which a voltage generated by the HF unit is compared with a voltage that is applied to the HF transmitting coil with which the HF pulse is emitted into the measurement object. This type of alignment measurement may be carried out once again after the second alignment measurement, and not, as previously, once before the first alignment measurement and once after the second alignment measurement.

It is also possible for the first alignment measurements to be carried out each time the measurement object is being moved through the MR facility. By way of example, these first alignment measurements may be carried out if an overview image of the measurement object is taken in which the measurement object is being moved through the MR facility.

The embodiments also relate to a MR facility for carrying out the method mentioned above, having a movable object table on which the measurement object is moved through the MR facility, and a control unit that carries out the first alignment measurements and the second alignment measurements, as described in detail above. An electronically readable data carrier with stored electronically readable control information is also provided. The control information may be configured in such a way that the control information carries out the method acts mentioned above when the data carrier is used in an arithmetic unit of a MR facility.

DETAILED DESCRIPTION

Figure 1:
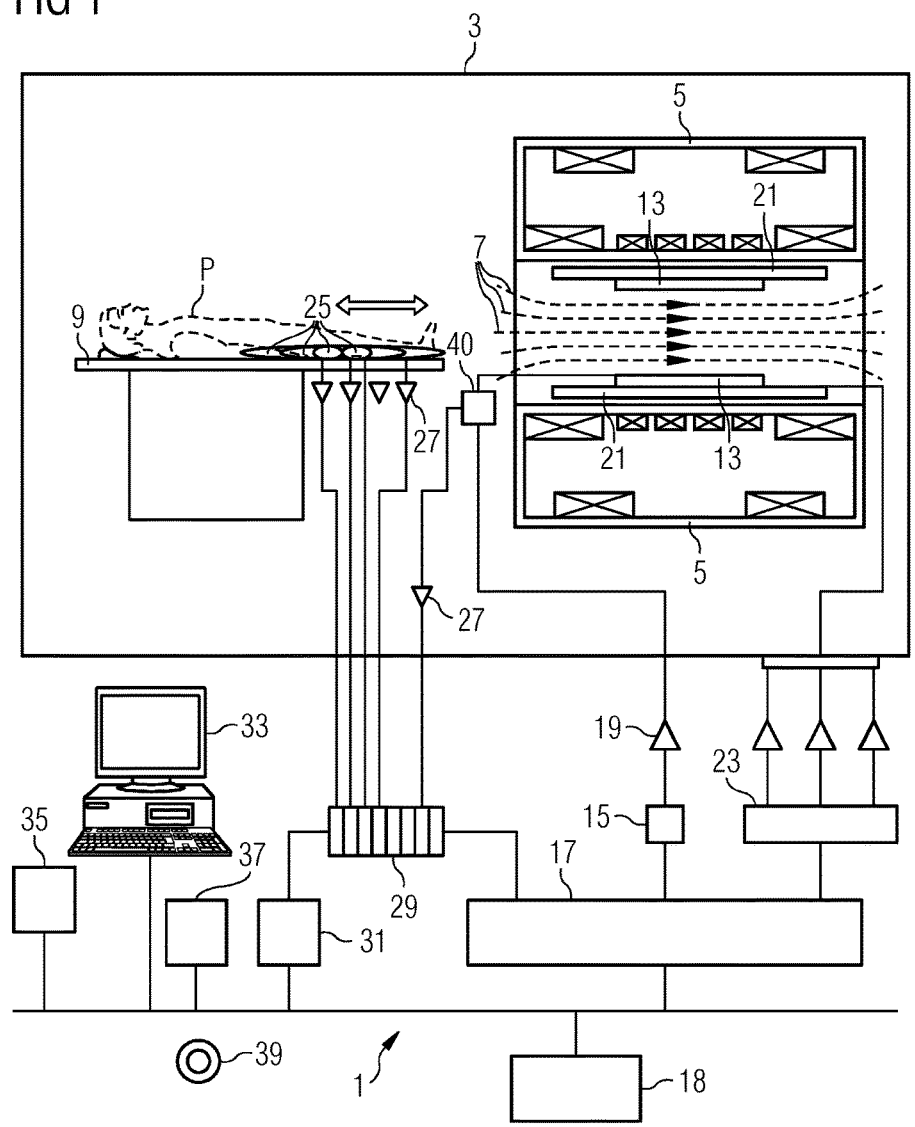
FIG. 1 schematically depicts a construction of an embodiment of a MR facility.

FIG. 1 schematically depicts the construction of a MR facility 1 with its components. To examine a body by magnetic resonance imaging, different magnetic fields that are matched to each other as exactly as possible in terms of their time-related and spatial characteristics are emitted onto the body.

A strong magnet, conventionally a cryomagnet 5 with a tunnel-like opening, arranged in a high frequency-shielded measuring cabin 3, generates a static strong main magnetic field 7 that may have a value of 0.2 tesla to 7 tesla and above. A measurement object, a body to be examined, or a body part, (here depicted as patient P), is positioned on an examination table 9 that may be moved continuously through the measuring volume of the magnetic resonance device and is moved into the homogeneous region of the main magnetic field 7 (e.g., measuring volume).

The nuclear spin of the body is excited by way of magnetic high frequency pulses (HF pulses) that are emitted via a high frequency antenna, depicted here as a body coil 13. The high frequency excitation pulses are generated by a HF unit 15 controlled by a pulse sequence control unit 17. After amplification by a high frequency amplifier 19, the HF pulses are conveyed to the high frequency antenna. The high frequency system depicted here is indicated only schematically. In certain embodiments, more than one HF unit 15, more than one high frequency amplifier 19, and a plurality of high frequency antennae are used in a MR facility 1.

The MR facility 1 also has gradient coils 21 with which magnetic gradient fields, (e.g., for selective layer excitation and for spatial encoding of the measuring signal), are emitted during a measurement. The gradient coils 21 are controlled by a gradient coil control unit 23 that, like the HF unit 15, is connected to the pulse sequence control unit 17. The pulse sequence control unit 17 is designed in such a way that a pulse sequence may be generated.

The signals emitted by the excited nuclear spin are received by the body coil 13 and/or local coils 25, amplified by associated high frequency pre-amplifiers 27, and processed further by a receiving unit 29 and digitized.

In the case of a coil that may be operated in both sending and transmitting modes, such as the body coil 13, correct signal relaying is controlled by a preceding transceiver switch 40.

The alignment measurements in the case of a moved and stationary measurement object may be controlled in a control unit 18. The evaluation of the alignment measurements may also be carried out there.

An image processing unit 31 generates an image from the measuring data that is displayed to a user by way of a control panel 33 or is stored in a storage unit 35. A central arithmetic unit 37 controls the individual facility components, in particular, during the recording of measuring data. The central arithmetic unit 37 is designed in such a way that movement of the examination table 9 and pulse sequences may be carried out and a method may be carried out. For this purpose, a computer program product by way of example is loaded onto the arithmetic unit 37 or included so that the computer program product may be run. The computer program product may be stored on an electronically readable data carrier, such as a DVD 39, so that this computer program product may then be read from the DVD 39 by the central arithmetic unit 37 and be run.

A person skilled in the art knows how a MR image is generated by the sequence of magnetic field gradients and HF pulses, and will not be explained in more detail. A plurality of iterations may be required for the adaptation of the MR facility 1 to the patient P. According to the prior art, the last-determined trigger frequency, regardless of the position at which this was determined, is used in the iterative alignment method in order to determine the trigger frequency. If this start value is not very close to the resonance frequency, then a plurality of iteration acts such as measurement, evaluation, and repeated measurement is necessary in order to obtain the optimized carrier frequency. In the prior art, a fixed start value was also used in the determination of the reference voltage, what is known as the transmitter alignment. As with the alignment of the carrier frequency, a plurality of iterations is also provided here if the start value is not close enough to the optimum transmitter voltage. For physical reasons, a certain waiting time in each case is maintained between iterations. The waiting time is about one second. In a further alignment, in the prior art, the voltage generated in the HF unit is compared with a voltage compared by sensors that are arranged on the transmitting coil. This test alignment was carried out twice in the prior art. The first test alignment determines rough characteristic values that serve as a prerequisite for frequency and transmitter alignment. A second, more accurate test alignment was then carried out using the results of the determination of the carrier frequency and the reference voltage.

A significant gain in time may be attained in the case of the stationary alignments, without a loss in quality, by the combination of alignments in the case of a moved measurement object and a stationary measurement object. If the results of alignments in the case of a moved measurement object are available, the results provide a MR carrier frequency or a reference voltage for different examination positions. These values are much closer to the optimum than the start values normally used in the case of the stationary alignments. A reduction of at least one iteration may consequently be achieved in the case of the stationary alignment measurements. One of the previously customary test alignments may also be omitted with the comparison of the voltage value in the case of the transmitting unit and generation.

Figure 2:
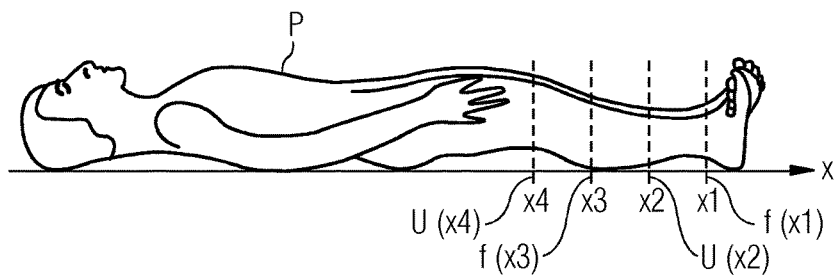
FIG. 2 schematically depicts an embodiment of how, for a person being examined as a measurement object, one MR system parameter respectively may be obtained in a first alignment measurement for different positions of the measurement object.

FIG. 2 depicts, by way of example, how location-dependent aligned MR system parameters result for the patient P for different positions of the patient. The person being examined or the patient P is moved into the MR facility. The first alignment measurement is carried out, (e.g., the determination of a reference voltage for the HF transmitting unit or the determination of the carrier frequency), for the region of the patient that is located exactly in the isocenter of the MR facility. Since each of these first alignment measurements requires a specific duration, and the patient P is moved further through the facility, differently adjusted MR system parameters respectively result for different positions of the patient. In a position X1 a carrier frequency f(x1) by way of example may be determined. The first alignment measurement for the reference voltage occurs in position X2, whereby a value U(x2) is determined at position X2. The positions X1 and X2 may each represent the geometric center of a region that is traveled through by the patient while the first alignment measurement is carried out. Different carrier frequencies or reference voltages therefore result for the different positions of the patient. Of course other MR system parameters may be measured during this first alignment measurement. By way of example, during this first alignment measurement, the position of the receiving coils is also determined and a DICO test alignment carried out. If measurements of the patient P are carried out in a fixed position in the MR facility, a second alignment measurement is in turn carried out in which the MR system parameter is iteratively configured to the measurement object in this fixed position. Carrier frequency and reference voltage may be determined with sufficient accuracy by way of the iterative method alone. In one iteration, one measurement respectively is carried out at a specific carrier frequency or reference voltage. The evaluation of this measurement calculates a better value that is used for the next iteration. The iterations end if the result is sufficiently accurate. The associated aligned MR system parameter from the first alignment measurement is used as a start value for this iteration. If, by way of example, a stationary MR measurement is carried out in the vicinity of position X4, the transmitter voltage determined at X4 is used as the start value for the iterative alignment. If the optimized MR parameter in the case of the second alignment measurement is in a region of the patient where there is no associated aligned MR system parameter from the first alignment measurement, the two adjacent MR system parameters respectively may be determined and a mean or an interpolation carried out to determine the start value for the iteration in the iterative alignment method. The voltage values at X2 and X4 may be interpolated by way of example for a transmitter voltage at X3.

Figure 3:
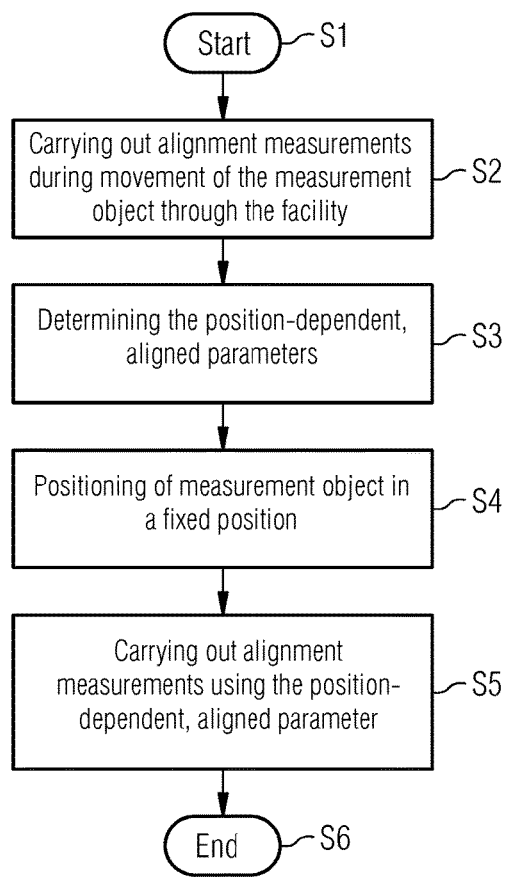
FIG. 3 depicts an example of a flow diagram for carrying out the method.

Acts of the method are summarized in FIG. 3. In act S1, the alignment measurements follow in an act S2 in which the measurement object is moved through the MR facility, so that aligned MR system parameters result, as is depicted by way of example in FIG. 2 (act S3).

If a MR measurement is to be carried out in a certain position in the MR facility while the measurement object is not moving, after positioning of the measurement object in act S4, an alignment measurement is carried out using the position-dependent aligned parameters that were determined in act S3 (act S5). The method ends in act S6.

With the act mentioned above, it is possible that the first alignment measurements of act S2 are carried out in the case of any movement of the measurement object, e.g., in the case of any movement of the examination table. It would also be possible, if the patient is moved into the center of the magnet at the start of the examination, for the necessary first alignment measurements to be carried out on this path to the isocenter. During this passage to the isocenter, the patients may likewise be moved a few centimeters further into the magnet than would be necessary for a correct positioning in order to be able to carry out further alignment measurements. This would be expedient, by way of example, if the actual person being examined differs by only a few centimeters from the initially determined center position, so a brief movement of the examination table is possibly not sufficient for a complete set of aligned MR system parameters in act S2.

Figure 4:
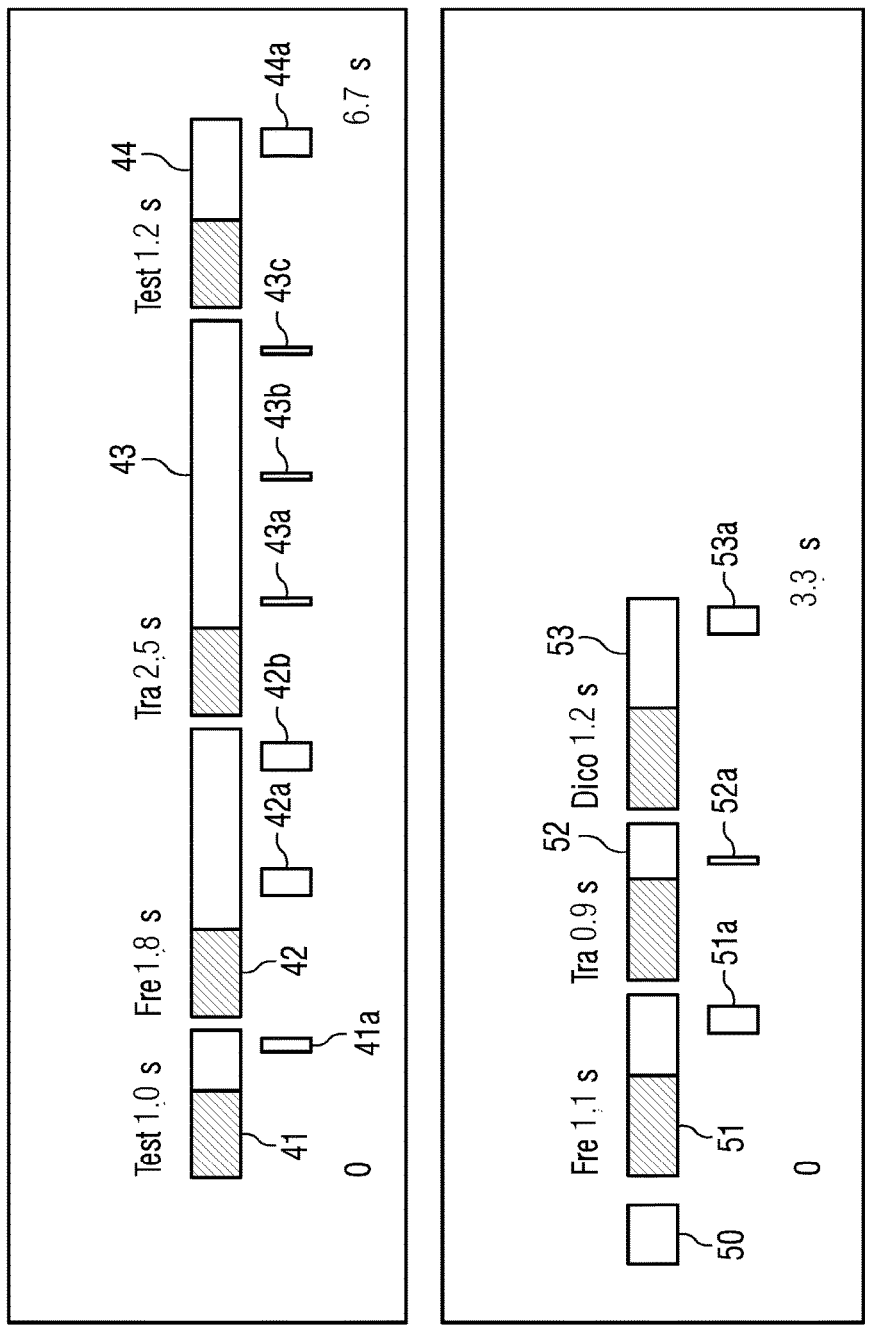
FIG. 4 depicts, on the basis of an example, the duration of alignment measurements according to the prior art compared to the method.

FIG. 4 depicts in an exemplary calculation how the alignment measurements may be reduced overall. The upper part of FIG. 4 depicts an alignment according to the prior art: in four different alignments 41-44 respectively firstly a test alignment is carried out in a first alignment 41, lasting one second by way of example, with the comparison of the voltage measured downstream of the HF amplifier with the voltage just upstream of the transmitting coil, with the alignment of the carrier frequency 42, the alignment of the reference voltage 43 and the second test alignment similar to in the alignment 41, the alignment 44. In the illustrated embodiment, the left-hand part in each alignment signifies the period in each case for the preparation of the measurement, and the right-hand part the execution of the measurement. The periods are schematically depicted, which are provided for the evaluation of the alignments, e.g., the periods 41a, 42a, 42b, 43a-43c and 44a. As may be seen in the case of alignments 42 and 43, two iterations are necessary for the alignment of the frequency while three iteration acts are necessary for the alignment of the voltage.

The alignment is depicted therebelow. Before the alignment depicted in FIG. 4, the first alignment measurements are carried out in the schematically illustrated alignment 50, in which the measurement object is moved through the facility. As may be seen in the lower part of FIG. 4, the alignment in the fixed table position of the carrier frequency 51, the alignment of the reference voltage 52, and the test alignment 53 that corresponds to test alignment 44 are carried out. As may be seen schematically in the evaluations 51a, 52a, and 53a, only one iteration act is now required per alignment measurement. In the example depicted in FIG. 4, the period for the alignment in the stationary position of the measurement object may be reduced from 6.7 to 3.3 seconds thereby. These figures may be taken as non-limiting examples, however, and depict the possible reduction potential. In addition to the carrier frequency and reference voltage determination the first alignment measurement also includes the DICO or test alignment. This may replace the first DICO alignment of the two alignment measurements.

To summarize, the combination of the measuring results, which were determined in the case of a moved measurement object and which are used as start values for the iteration for the iterative alignment measurements in the case of fixed positions, provides a reduction in the measuring time.

The above-described method may be implemented via a computer program product including one or more readable storage media having stored thereon instructions executable by one or more processors of the computing system. Execution of the instructions causes the computing system to perform operations corresponding with the acts of the method described above.

The instructions for implementing processes or methods described herein may be provided on non-transitory computer-readable storage media or memories, such as a cache, buffer, RAM, FLASH, removable media, hard drive, or other computer readable storage media. A processor performs or executes the instructions to train and/or apply a trained model for controlling a system. Computer readable storage media include various types of volatile and non-volatile storage media. The functions, acts, or tasks illustrated in the figures or described herein may be executed in response to one or more sets of instructions stored in or on computer readable storage media. The functions, acts or tasks may be independent of the particular type of instruction set, storage media, processor or processing strategy and may be performed by software, hardware, integrated circuits, firmware, micro code and the like, operating alone or in combination. Likewise, processing strategies may include multiprocessing, multitasking, parallel processing and the like.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for carrying out alignment measurements in a magnetic resonance (MR) facility, the method comprising:
    carrying out first alignment measurements while a measurement object is being moved through the MR facility, wherein at least one MR system parameter of the MR facility is configured to the measurement object for the first alignment measurements, whereby one aligned MR system parameter is determined for each position of a plurality of different positions of the measurement object in the MR facility; and
    carrying out a second alignment measurement while the measurement object is stationary in the MR facility, wherein the second alignment measurement comprises an iterative alignment method, wherein the at least one MR system parameter for the recording of MR signals of the measurement object in the MR facility is iteratively configured to the measurement object,
    wherein for the iterative alignment method, the aligned MR system parameter is chosen from the aligned MR system parameters, determined in the first alignment measurements for the plurality of different positions, whose position best matches a fixed position, and the chosen aligned MR system parameter is used as a start value for the iterative alignment method for the fixed position.

2. The method as claimed in claim 1, wherein the MR facility comprises a high-frequency (HF) unit for generating and emitting HF pulses into the measurement object, and the MR system parameter is a HF parameter of the HF unit, which is configured to the measurement object.

3. The method as claimed in claim 2, wherein the first alignment measurements comprise an alignment of a reference voltage used for generating the HF pulses, wherein one reference voltage is determined for each position of the plurality of different positions of the measurement object in the MR facility,
    wherein a reference voltage is determined in the fixed position in the second alignment measurement in the iterative alignment method, and
    wherein, for the iterative alignment method, the reference voltage is chosen from the first alignment measurements whose associated position best matches the fixed position, wherein the chosen aligned reference voltage from the first alignment measurements is used as a start value for the iterative alignment method for the fixed position in order to determine the reference voltage for the second alignment measurement.

4. The method as claimed in claim 2, wherein the first alignment measurements comprise a frequency alignment, wherein the frequency of the HF pulses is configured to the resonance frequency of the measurement object to determine a respective carrier frequency,
    wherein one MR carrier frequency is determined for each position of the plurality of different positions of the measurement object in the MR facility, wherein a MR carrier frequency for the fixed position is determined for the second alignment measurement in the iterative alignment method, and
    wherein, for the iterative alignment method, the carrier frequency is selected from the first alignment measurements whose associated position best matches the fixed position, wherein the chosen aligned carrier frequency from the first alignment measurements is used as a start value for the iterative alignment method for the fixed position in order to determine the carrier frequency in the second alignment measurement.

5. The method as claimed in claim 4, wherein the first alignment measurements comprise an alignment of a reference voltage used for generating the HF pulses, wherein one reference voltage is determined for each position of the plurality of different positions of the measurement object in the MR facility,
    wherein a reference voltage is determine in the fixed position in the second alignment measurement in the iterative alignment method, and
    wherein, for the iterative alignment method, the reference voltage is chosen from the first alignment measurements whose associated position best matches the fixed position, wherein the chosen aligned reference voltage from the first alignment measurements is used as a start value for the iterative alignment method for the fixed position in order to determine the reference voltage for the second alignment measurement.

6. The method as claimed in claim 5, wherein the first alignment measurements are carried out while the measurement object is being moved into the MR facility for the first time during an examination.

7. The method as claimed in claim 6, wherein, for the first alignment measurements, the MR system parameter is respectively determined for the position of the measurement object located in an isocenter of the MR facility, and
    wherein, when the measurement object is moved into the MR facility for the first time, the measurement object is moved beyond an isocenter of the MR facility in order to enlarge the section of the measurement object for which there is one position-dependent aligned MR system parameter respectively from the first alignment measurements.

8. The method as claimed in claim 7, further comprising:
    carrying out a third alignment measurement, wherein a voltage generated in the HF unit is compared with a voltage applied to a HF transmitting coil with which the HF pulse is emitted into the measurement object, wherein this third alignment measurement is carried out only once after the second alignment measurement.

9. The method as claimed in claim 8, wherein the first alignment measurements are carried out each time the measurement object is moved through the MR facility.

10. The method as claimed in claim 9, wherein the first alignment measurements are carried out while at least one overview image of the measurement object is taken.

11. The method as claimed in claim 10, wherein the chosen aligned carrier frequency is used as a start value for the iterative alignment method in order to determine the carrier frequency for the second alignment measurement, and
    wherein the chosen aligned reference voltage from the first alignment measurements is used as a start value for the iterative alignment method in order to determine the reference voltage for the second alignment measurement.

12. The method as claimed in claim 1, wherein the first alignment measurements are carried out while the measurement object is being moved into the MR facility for the first time during an examination.

13. The method as claimed in claim 12, wherein, for the first alignment measurements, the MR system parameter is respectively determined for the position of the measurement object located in an isocenter of the MR facility, and
wherein, when the measurement object is moved into the MR facility for the first time, the measurement object is moved beyond an isocenter of the MR facility in order to enlarge the section of the measurement object for which there is one position-dependent aligned MR system parameter respectively from the first alignment measurements.

14. The method as claimed in claim 1, further comprising:
carrying out a third alignment measurement, wherein a voltage generated in the HF unit is compared with a voltage applied to a HF transmitting coil with which the HF pulse is emitted into the measurement object, wherein this third alignment measurement is carried out only once after the second alignment measurement.

15. The method as claimed in claim 1, wherein the first alignment measurements are carried out each time the measurement object is moved through the MR facility.

16. The method as claimed in claim 1, wherein the first alignment measurements are carried out while at least one overview image of the measurement object is taken.

17. The method as claimed in claim 1, wherein the MR system parameter determined for each position of a plurality of different positions of the measurement object in the MR facility is a carrier frequency,
wherein the aligned carrier frequency is used as a start value for the iterative alignment method in order to determine the carrier frequency for the second alignment measurement, and
wherein the chosen aligned reference voltage from the first alignment measurements is used as a start value for the iterative alignment method in order to determine the reference voltage for the second alignment measurement.

18. A magnetic resonance (MR) facility configured to carry out alignment measurements, the MR facility comprising:
a movable object table on which a measurement object is configured to move through the MR facility; and
a control unit configured to carry out first alignment measurements while the measurement object on the object table is being moved through the MR facility,
wherein, for the first alignment measurements, the control unit configures at least one MR system parameter of the MR facility to the measurement object, wherein one aligned MR system parameter is determined for each position of a plurality of different positions of the measurement object in the MR facility,
wherein the control unit is configured to carry out a second alignment measurement, wherein the measurement object is stationary in a fixed position in the MR facility,
wherein the second alignment measurement comprises an iterative alignment method, in which the at least one MR system parameter is iteratively configured to the measurement object for the recording of MR signals of the measurement object for the fixed position in the MR facility,
wherein, for the iterative alignment method, the control unit chooses from the aligned MR system parameters for the plurality of different positions determined in the first alignment measurements the aligned MR system parameter whose position best matches a fixed position, and the chosen aligned MR system parameter is used as a start value for the iterative alignment method for the fixed position.

19. An electronically readable non-transitory data carrier with electronically readable control information stored thereon, wherein when the data carrier is used in an arithmetic unit of a magnetic resonance (MR) facility, the data carrier is configured to at least perform:
carrying out first alignment measurements while a measurement object is being moved through the MR facility, wherein at least one MR system parameter of the MR facility is configured to the measurement object for the first alignment measurements, whereby one aligned MR system parameter is determined for each position of a plurality of different positions of the measurement object in the MR facility; and
carrying out a second alignment measurement while the measurement object is stationary in the MR facility, wherein the second alignment measurement comprises an iterative alignment method,
wherein the at least one MR system parameter for the recording of MR signals of the measurement object in the MR facility is iteratively configured to the measurement object,
wherein for the iterative alignment method, the aligned MR system parameter is chosen from the aligned MR system parameters, determined in the first alignment measurements for the plurality of different positions, whose position best matches a fixed position, and the chosen aligned MR system parameter is used as a start value for the iterative alignment method for the fixed position.

* * * * *